(12) United States Patent
Dickerson (10) Patent No.: US 10,027,307 B2
(45) Date of Patent: *Jul. 17, 2018

(54) ULTRA BROADBAND NETWORK OF FIXED OR SWITCHED FREQUENCY SELECTIVE FILTERS

(71) Applicant: Roger W. Dickerson, Loveland, OH (US)

(72) Inventor: Roger W. Dickerson, Loveland, OH (US)

(*) Notice: Subject to any disclaimer, the term of this patent is extended or adjusted under 35 U.S.C. 154(b) by 0 days.

This patent is subject to a terminal disclaimer.

(21) Appl. No.: 15/440,003

(22) Filed: Feb. 23, 2017

(65) Prior Publication Data

US 2017/0163238 A1    Jun. 8, 2017

Related U.S. Application Data

(63) Continuation of application No. 15/182,123, filed on Jun. 14, 2016, now Pat. No. 9,614,492.

(60) Provisional application No. 62/175,360, filed on Jun. 14, 2015.

(51) Int. Cl.
*H03H 7/46* (2006.01)
*H03H 7/075* (2006.01)
*H03H 7/01* (2006.01)
*H03H 7/06* (2006.01)

(52) U.S. Cl.
CPC .............. *H03H 7/461* (2013.01); *H03H 7/06* (2013.01); *H03H 7/075* (2013.01); *H03H 7/1758* (2013.01)

(58) Field of Classification Search
CPC .... H03H 7/0138; H03H 7/0161; H03H 7/461; H03H 7/06; H03H 7/075; H03H 7/1758

USPC .......... 333/132, 134, 165–167; 327/551–559
See application file for complete search history.

(56) References Cited

U.S. PATENT DOCUMENTS

| 5,155,724 | A | 10/1992 | Edwards |
| 6,975,841 | B2 | 12/2005 | Uriu et al. |
| 8,350,642 | B2 | 1/2013 | Jensen |
| 8,680,947 | B1 | 3/2014 | Costa et al. |
| 9,325,042 | B2 | 4/2016 | Taniuchi et al. |
| 9,614,492 | B2 * | 4/2017 | Dickerson ............ H03H 7/0161 |
| 2008/0013637 | A1 | 1/2008 | Kodama et al. |
| 2009/0268647 | A1 | 10/2009 | Uejima |
| 2010/0117653 | A1 | 5/2010 | Oppelt |
| 2014/0035700 | A1 | 2/2014 | Zeng et al. |
| 2014/0036744 | A1 | 2/2014 | Zeng et al. |

(Continued)

FOREIGN PATENT DOCUMENTS

CN       2831457 A      10/2006
CN     104937846 A       9/2015
(Continued)

OTHER PUBLICATIONS

Young, Lee W.; International Search Report and Written Opinion of the International Searching Authority issued in International Application No. PCT/US2016/037387; dated Sep. 22, 2016; 9 pages.

(Continued)

*Primary Examiner* — Thomas Skibinski
(74) *Attorney, Agent, or Firm* — Ulmer & Berne LLP (57) ABSTRACT

An extensible filter structure is disclosed allowing realizable effective filtering over many decades in frequency. Multiple devices operating with mismatched frequency ranges can be multiplexed together with or without switching.

20 Claims, 10 Drawing Sheets

(56) References Cited

U.S. PATENT DOCUMENTS

2015/0303891 A1* 10/2015 Muterspaugh .......... H03H 7/38
                                                  333/132

FOREIGN PATENT DOCUMENTS

EP           1006669 A1    6/2000
EP           1283599 A1    2/2003

OTHER PUBLICATIONS

K&L Microwave (MPG Salisbury); 2008 Product Catalog, Multiplexers section; pp. 76-79; downloaded from http://www.klmicrowave.com/catalog/KLCat08.pdf.

* cited by examiner

ULTRA BROADBAND NETWORK OF FIXED OR SWITCHED FREQUENCY SELECTIVE FILTERS

RELATED APPLICATIONS

This application is a continuation of U.S. patent application Ser. No. 15/182,123, filed Jun. 14, 2016, which claims the benefit of Provisional Application Ser. No. 62/175,360, filed Jun. 14, 2015, the contents of each of which are incorporated herein by reference.

TECHNICAL FIELD

The systems described herein generally relate to an electrical circuit that utilizes a plurality of diplexers.

BACKGROUND

Conventional wideband switching networks have been designed to steer signals through appropriate narrower band filters. Each filter is accessed individually according to the switch settings. As the number of filters increases, the switching losses increase correspondingly.

Conventional diplexer structures are not generally considered to have acceptable performance over a wide frequency band (greater than one decade in frequency). Some cascaded diplexers can allow realizable concurrent frequency selective filtering over 4 decades in frequency.

Networks that combine bandpass filters into a broader band common port exist. One example is a log periodic antenna that combines multiple band pass antenna elements into a broader contiguous frequency band in parallel along a transmission line. Antenna multicouplers typically use several bandpass filters in parallel to combine several radios to a single antenna. The parallel arrangement means the undesired resonances are not decoupled from the output.

The novel filter network arrangement disclosed, allows multiple filters to be accessed concurrently. Additionally, switching may be embedded inside the filter network, avoiding the cascaded switching losses.

SUMMARY

In accordance with one embodiment, an electrical circuit comprises a first diplexer and a second diplexer. The first diplexer comprises a first low pass filter and a first high pass filter. The first low pass filter comprises a first input and a first output. The first low pass filter defines a first low pass cutoff frequency. The first high pass filter comprises a second input and a second output. The first high pass filter defines a first high pass cutoff frequency and the first and second inputs are directly electrically coupled together. The second diplexer comprises a second low pass filter and a second high pass filter. The second low pass filter comprises a third input and a third output. The second low pass filter defines a second low pass cutoff frequency. The second high pass filter comprises a fourth input and a fourth output. The second high pass filter defines a second high pass cutoff frequency. The first output, the third input, and the fourth input are electrically coupled together. The second low pass cutoff frequency is less than the first low pass cutoff frequency. The second high pass cutoff frequency is less than the first high pass cutoff frequency.

BRIEF DESCRIPTION OF THE DRAWINGS

It is believed that certain embodiments will be better understood from the following description taken in conjunction with the accompanying drawings in which.

DETAILED DESCRIPTION

Figure 1:
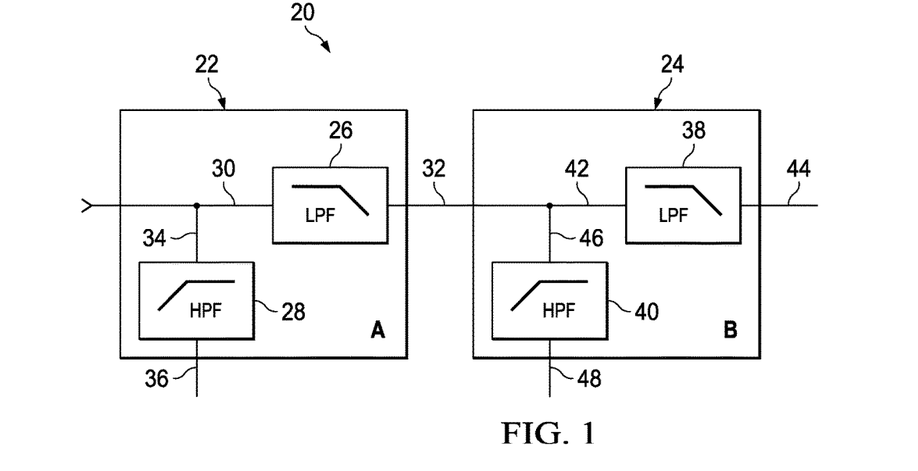
FIG. 1 is a schematic block diagram depicting an electrical circuit having a plurality of diplexers, in accordance with one embodiment.
Figure 17:
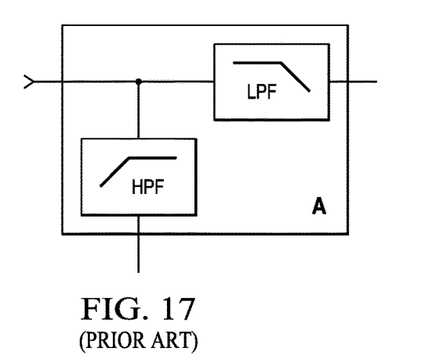
FIG. 17 is a schematic block diagram depicting a conventional diplexer arrangement.

In connection with the views and examples of FIGS. 1-16, wherein like numbers indicate the same or corresponding elements throughout the views, an electrical circuit 20 is illustrated in FIG. 1 and is shown to include a first diplexer 22 and a second diplexer 24 that are electrically connected together such that they can be considered "cascaded". The first diplexer 22 comprises a low pass filter 26 and a high pass filter 28. The low pass filter 26 comprises an input 30 and an output 32 and defines a low pass cutoff frequency. The high pass filter 28 comprises an input 34 and an output 36 and defines a high pass cutoff frequency that is substantially the same as the low pass cutoff frequency of the low pass filter 26. The inputs 30, 34 of the low and high pass filters 26, 28 are directly electrically coupled together. The second diplexer 24 comprises a low pass filter 38 and a high pass filter 40. The low pass filter 38 comprises an input 42 and an output 44 and defines a low pass cutoff frequency. The high pass filter 40 comprises an input 46 and an output 48 and defines a high pass cutoff frequency that is substantially the same as the low pass cutoff frequency of the low pass filter 38. The output 36 of the high pass filter 28 of the first diplexer 22 is directly electrically coupled with each of the inputs 42, 46 of the respective low and high pass filters 38, 40 of the second diplexer 24. One example of a conventional diplexer is illustrated in FIG. 17.

The low pass cutoff frequency of the low pass filter 38 of the second diplexer 24 can be less than the low pass cutoff frequency of the low pass filter 26 of the first diplexer 22. The low pass cutoff frequency of the low pass filter 38 of the second diplexer 24 can be less than the low pass cutoff frequency of the low pass filter 26 of the first diplexer 22. The high pass cutoff frequency of the high pass filter 40 of the second diplexer 24 can be less than the high pass cutoff frequency of the high pass filter 28 of the first diplexer 22. It is to be appreciated that the high pass and low pass filters 26, 28, 38, 40 can be complementary and cascaded in a particular manner to achieve a network of filters capable of combining or separating bandlimited signal paths to or from a common broader bandwidth signal path. Separated signal paths can be switched and then recombined to a common signal path thus allowing individual control of each bandlimited signal path between a single input and output.

If a desired diplexer design becomes sufficiently complex, any of a variety of methods can be employed to dampen undesired resonances. For example, realizable, non-ideal inductors and capacitors can be constructed so that undesired resonances fall well above the cutoff frequency of the filter in which they are used. These resonances can compromise the broadband performance of the filters if they are used in an externally switched network. These resonances above cutoff inside the network are successively suppressed behind low pass filters having successively higher cutoff frequencies moving toward the outside of the network. If properly designed, the only resonances measurable will be from diplexer closest to the outside of the network. This allows the designer to make the undesired resonances as high as needed. Computer simulations have demonstrated flybacks above 100 GHz on a filter built into an integrated circuit. The filter provides controlled selectivity down to 0 Hz. Additionally or alternatively resonances from the interactions between sufficiently complex diplexers can be suppressed by internal filters having their own terminations. These internally terminated filters can be connected to the diplexer outputs or be knitted into the diplexer's high pass and low pass ladder structure by sharing a ladder component. Their cutoff frequencies can be well above or below the band of the respective signal path to which they are connected so they cause very little effective loss to the desired signal paths.

Figure 2:
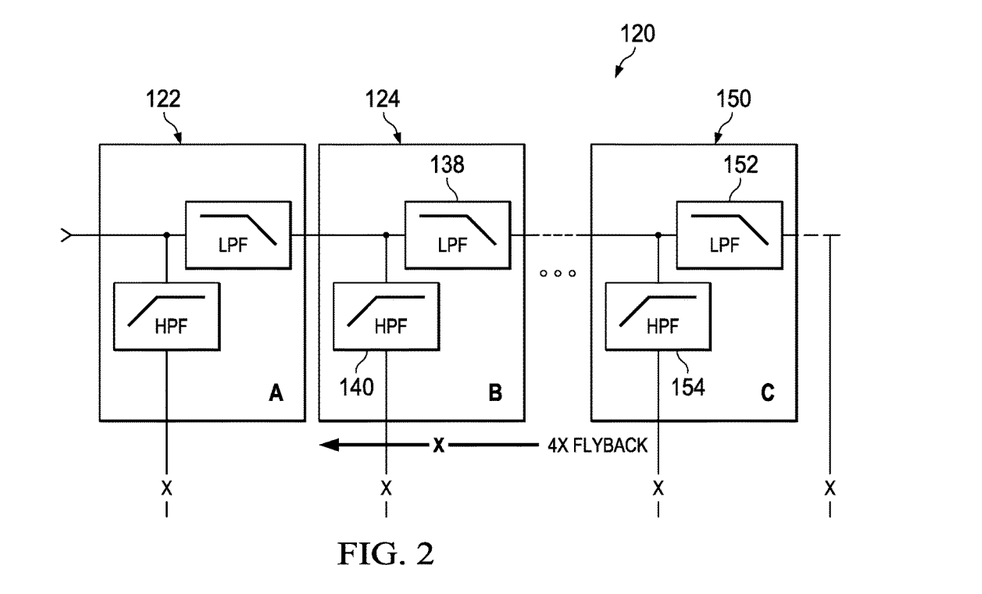
FIG. 2 is a schematic block diagram depicting an electrical circuit having a plurality of diplexers, in accordance with another embodiment.

FIG. 2 illustrates an electrical circuit 120 according to another embodiment that includes a first diplexer 122, a second diplexer 124, and a third diplexer 150 that are provided in a cascaded arrangement. The first and second diplexers 122, 124 can be similar to or the same as the first and second diplexers 22, 24 illustrated in FIG. 1. The third diplexer 150 can be similar to or the same as either of the first and second diplexers 22, 24 illustrated in FIG. 1. A low pass cutoff frequency of a low pass filter 152 of the third diplexer 150 can be less than a low pass cutoff frequency of a low pass filter 138 of the second diplexer 124. A high pass cutoff frequency of a high pass filter 154 of the third diplexer 150 can be less than a high pass cutoff frequency of a high pass filter 140 of the second diplexer 124. The low pass cutoff frequency of the low pass filter 152 and the high pass cutoff frequency of the high pass filter 154 can be substantially the same. It is to be appreciated that any quantity of diplexers can be cascaded together similar to FIGS. 1 and 2.

Figure 3:
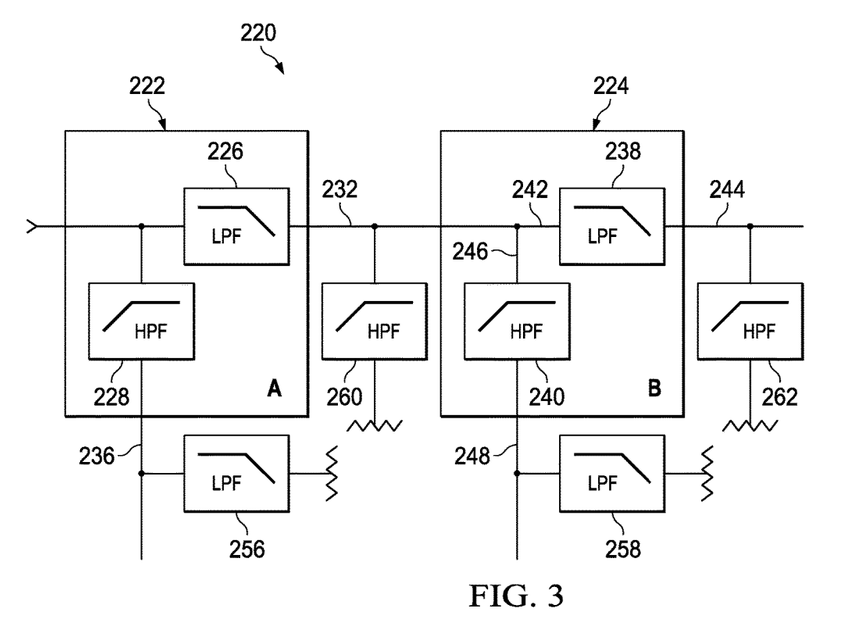
FIG. 3 is a schematic block diagram depicting an electrical circuit having a plurality of diplexers and terminated filters, in accordance with one embodiment.

FIG. 3 illustrates an electrical circuit 220 according to another embodiment that includes a first diplexer 222 and a second diplexer 224 that are provided in a cascaded arrangement. The first and second diplexers 222, 224 can be similar to or the same as the first and second diplexers 22, 24 illustrated in FIG. 1. The electrical circuit 220 however can include a first terminated low pass filter 256, a second terminated low pass filter 258, a first terminated high pass filter 260, and a second terminated high pass filter 262. The first terminated low pass filter 256 can be electrically coupled to an output 236 of a high pass filter 228 of the first diplexer 222. The first terminated high pass filter 260 can be electrically coupled to the interconnection between an output 232 of a low pass filter 226 of the first diplexer 222 and inputs 242, 246 of respective low and high pass filters 238, 240 of the second diplexer 224. The second terminated low pass filter 258 can be electrically coupled to an output 248 of a high pass filter 240 of the second diplexer 224. The second terminated high pass filter 262 can be electrically coupled to an output 244 of a low pass filter 238 of the second diplexer 222. The first terminated low pass filter 256 can have a cutoff frequency that is less than the cutoff frequency of the high pass filter 228 of the first diplexer 222. The first terminated high pass filter 260 can have a cutoff frequency that is higher than the cutoff frequency of the low pass filter 226 of the first diplexer 222. The second terminated low pass filter 258 can have a cutoff frequency that is less than the cutoff frequency of the high pass filter 240 of the second diplexer 224. The second terminated high pass filter 262 can have a cutoff frequency that is higher than the cutoff frequency of the low pass filter 238 of the second diplexer 224.

Singly terminated filters, such as the first and second terminated low pass filters 256, 258 and the first and second terminated high pass filters 260, 262, can be an optimized class of filters for the high pass and low pass filters that constitute the diplexers. Singly terminated filters can be designed to be driven from either a voltage or current source. Singly terminated filters can consist of series and shunt inductors and capacitors that are arranged in alternating fashion in a two port ladder network. A voltage source can be connected to the singly terminated filter using a series inductor or capacitor. A current source can be connect to the singly terminated filter using a shunt inductor or capacitor. A voltage sourced singly terminated filter can have a high impedance resisting the flow of current in its rejection band and can allow power to flow from the source to a resistive termination in its passband. A current sourced singly terminated filter can have a low impedance resisting the production of a voltage in its rejection band and can allow power to flow from the source to a resistive termination in its passband. Singly terminated high and low pass filters can be designed to be voltage sourced with a series inductor or capacitor and can have equivalent cutoff frequencies that are connected in parallel. Each filter therefore can present a high impedance in its rejection band while combining at, above and below the cutoff frequency to provide a resistive impedance to the common connected source.

Figure 4:
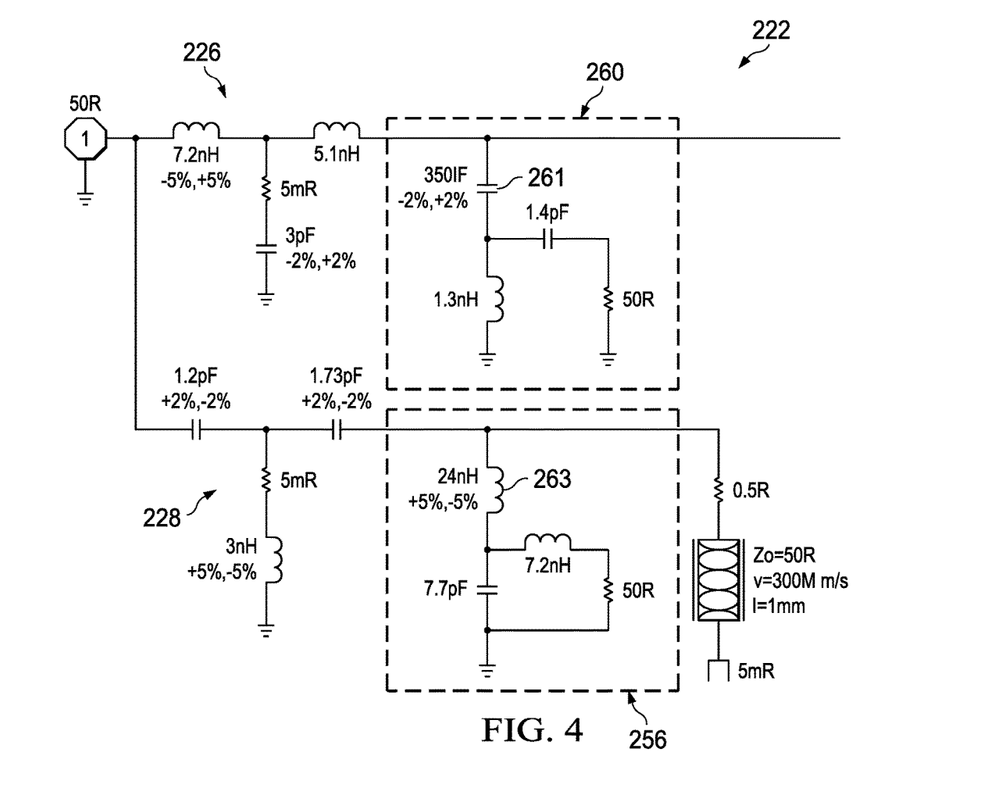
FIG. 4 is a schematic view depicting one example of the electrical circuit of FIG. 3.

FIG. 4 illustrates an example of the first diplexer 222 of the electrical circuit 220 of FIG. 3. The low pass filter 226, the high pass filter 228, the first terminated low pass filter 256, and the first terminated high pass filter 260 are shown to each be formed of a variety of resistors, inductors, and/or capacitors. The capacitor 261 of the low pass filter 226 and the inductor 263 of the high pass filter 228 can be utilized by the first terminated low pass filter 256 and the first terminated high pass filter 260, respectively (thus effectively sharing a component) which can minimize the complexity of the electrical circuit 220. The second diplexer 224 can also be similarly configured to have a shared capacitor and inductor.

Figure 5:
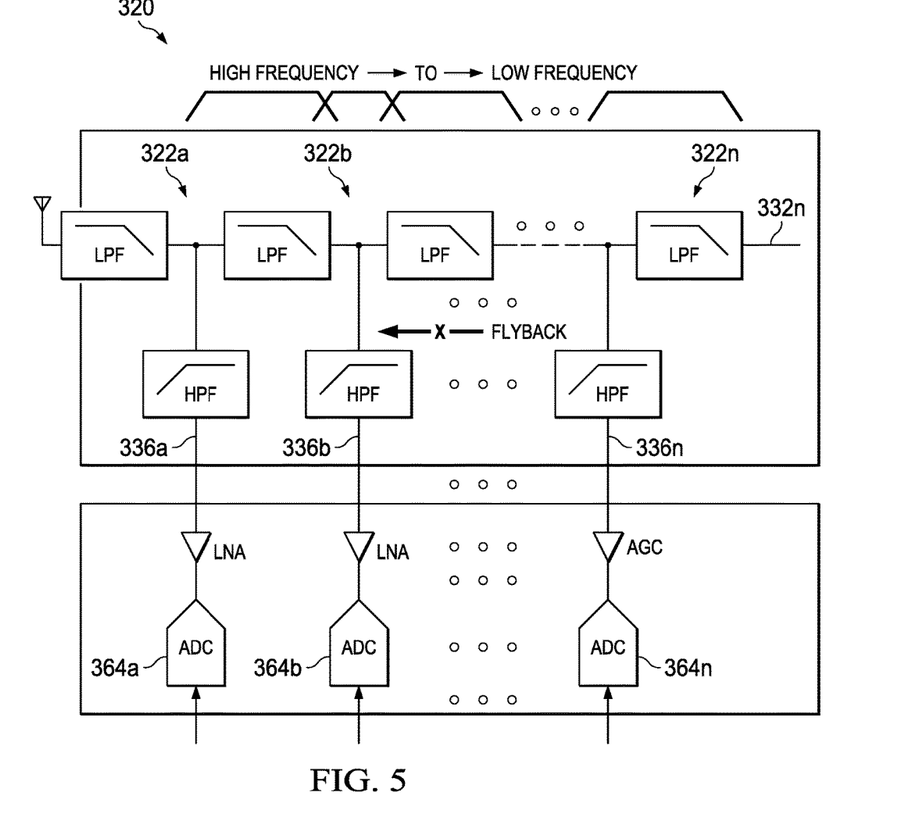
FIG. 5 is a schematic block diagram depicting an electrical circuit having a plurality of diplexers and A/D converters, in accordance with one embodiment.

FIG. 5 illustrates an electrical circuit 320 according to another embodiment that includes a plurality of diplexers 322a, 322b, . . . 322n that are provided in a cascaded arrangement. The plurality of diplexers 322a, 322b, . . . 322n can be similar to or the same as the first and second diplexers 22, 24 illustrated in FIG. 1. A plurality of analog to digital (A/D) converters 364a, 364b, . . . 364n can be electrically coupled to respective high pass filter outputs 336a, 336b, . . . 336n. The low pass output having the lowest cutoff frequency (e.g., 332n) can also be electrically coupled to the A/D converter 364n. The A/D converters 364a, 364b, . . . 364n can create a composite channelized A/D converter covering a greater band than an individual A/D converter. It is to be appreciated that, in some embodiments, digital to analog (D/A) converters can be used in lieu of the A/D converters 364a, 364b, . . . 364n. In some embodiments, high pass filter outputs 336a, 336b, . . . 336n as well as the low pass output having the lowest cutoff frequency (e.g., 332n) can be additionally or alternatively connected to frequency mixers creating a channelized down converter that allows a significant multiplication factor over the effective bandwidth of conventional technologies.

Figure 6:
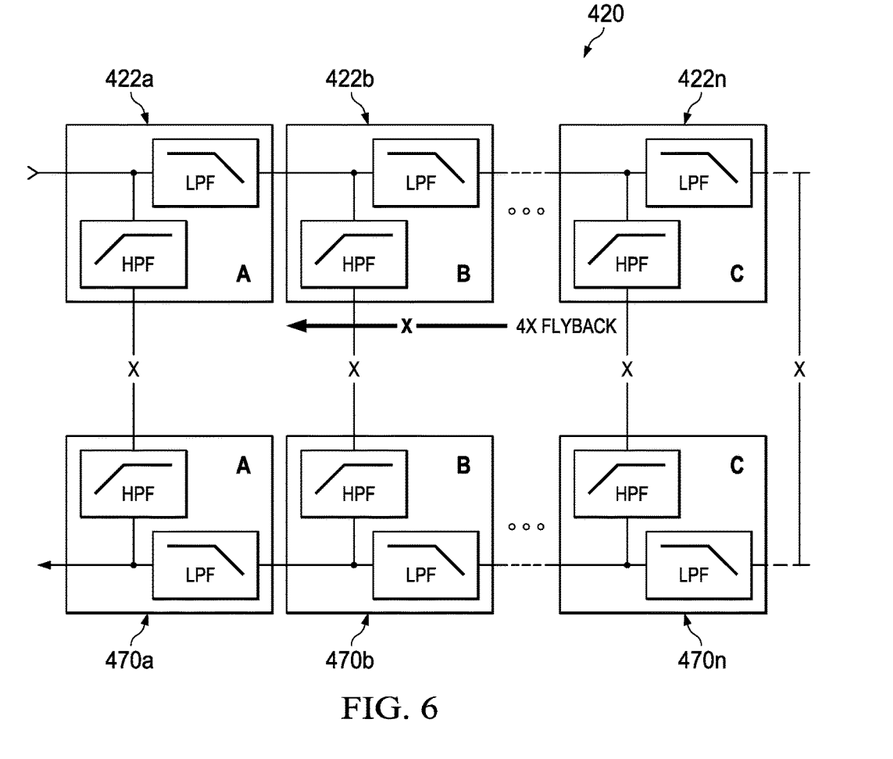
FIG. 6 is a schematic block diagram depicting an electrical circuit having a plurality of diplexers and A/D converters, in accordance with one embodiment.
Figure 7:
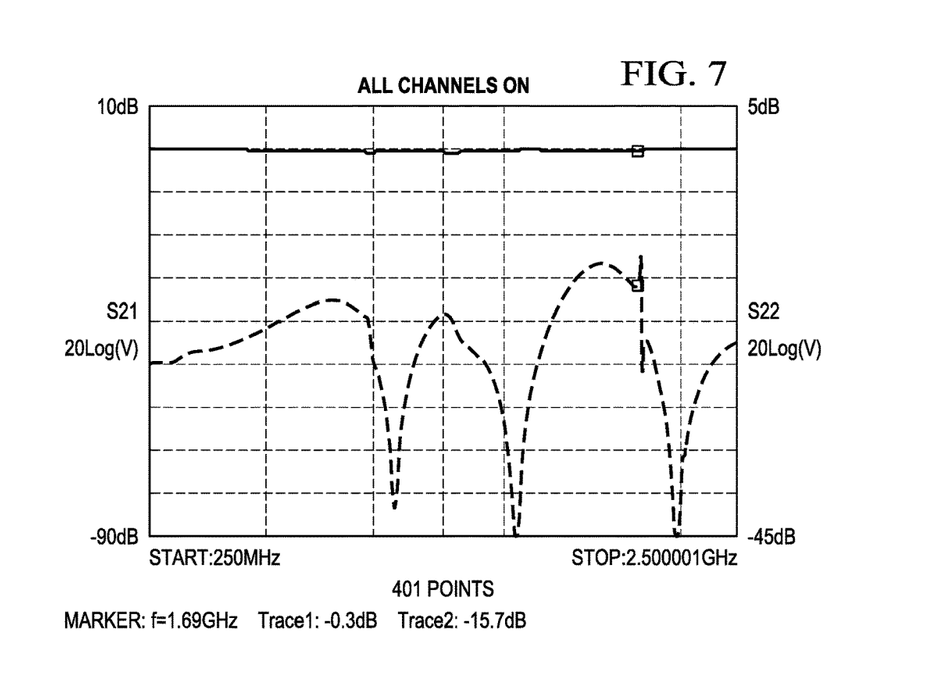
FIGS. 7-16 depict different plots depicting the frequency response of the electrical circuit of FIG. 6 based upon different switching conditions.
Figure 8:
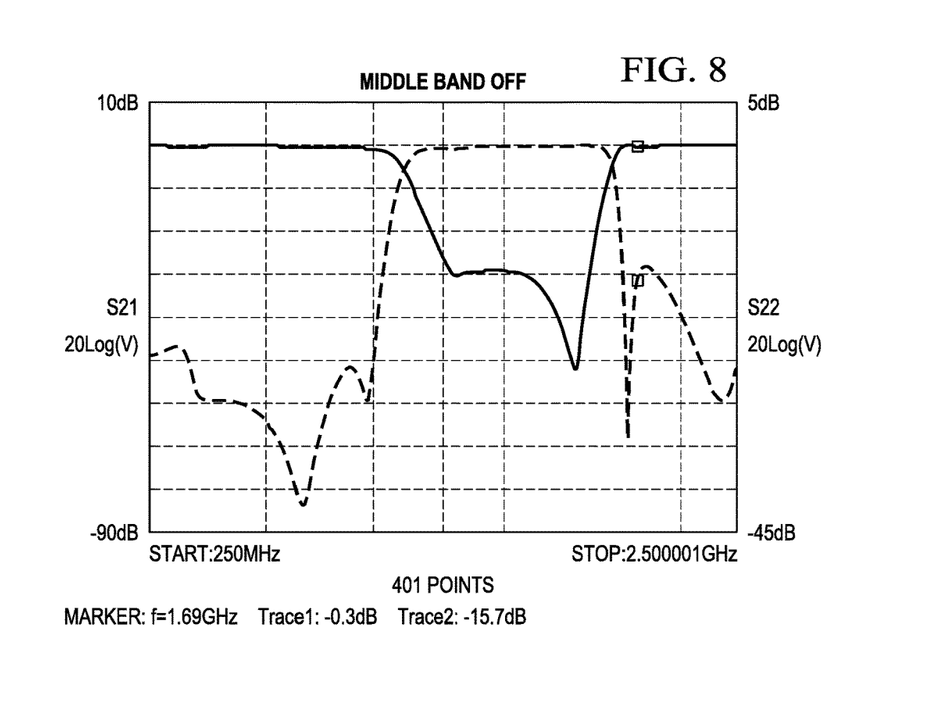
Figure 9:
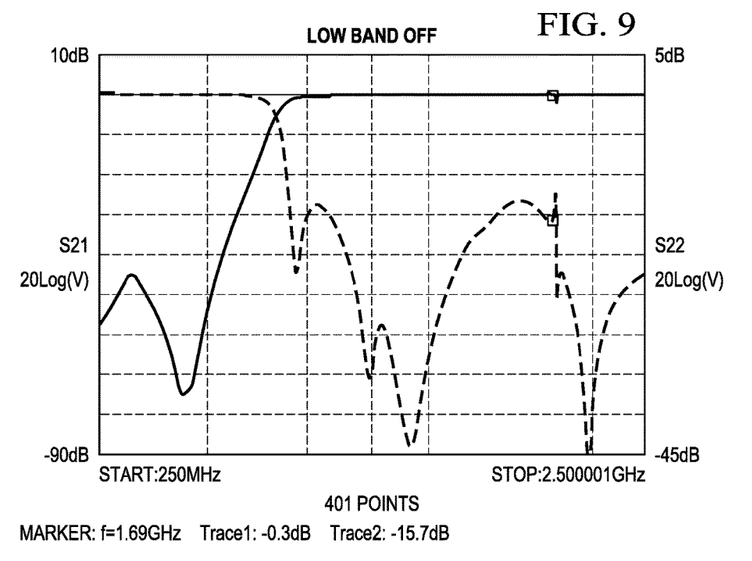
Figure 10:
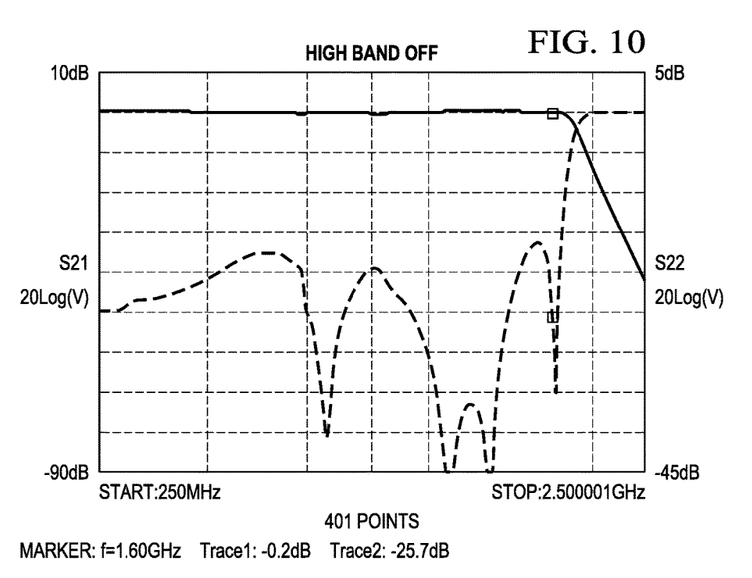
Figure 11:
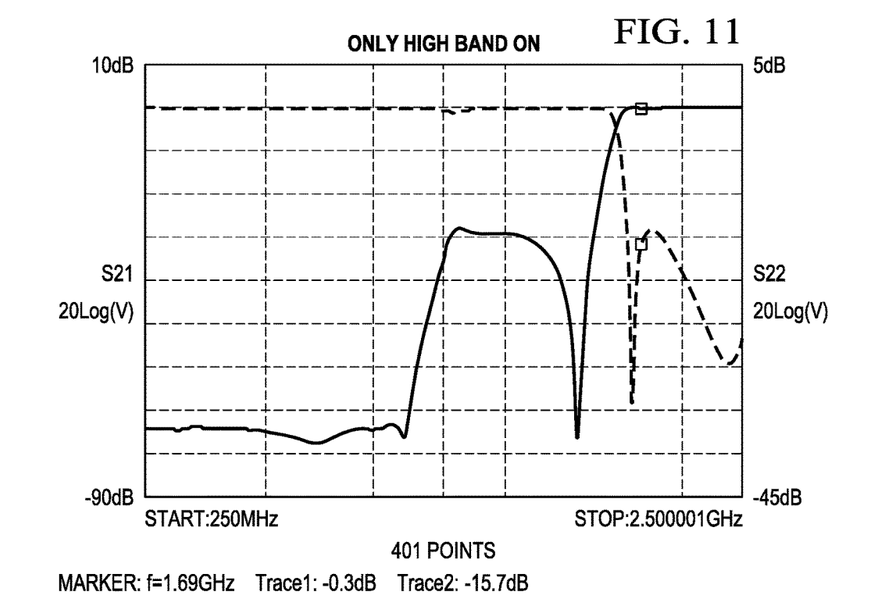
Figure 12:
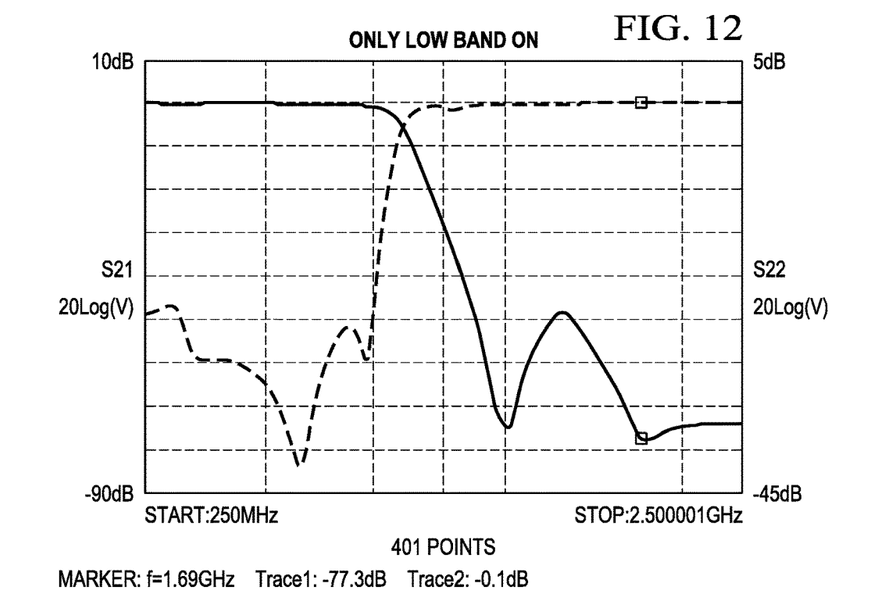
Figure 13:
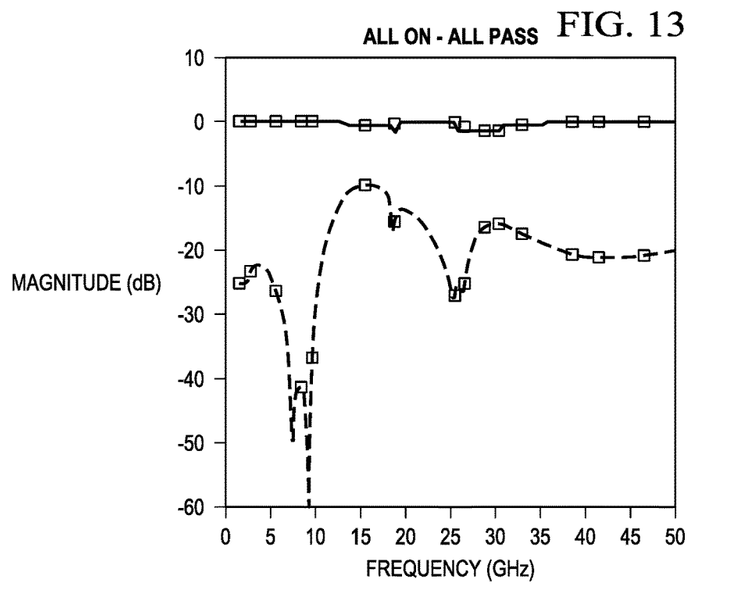
Figure 14:
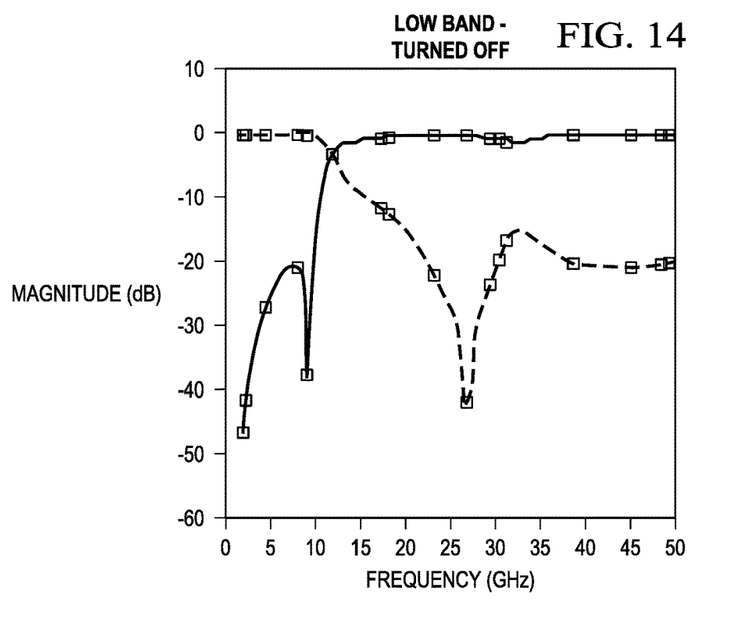
Figure 15:
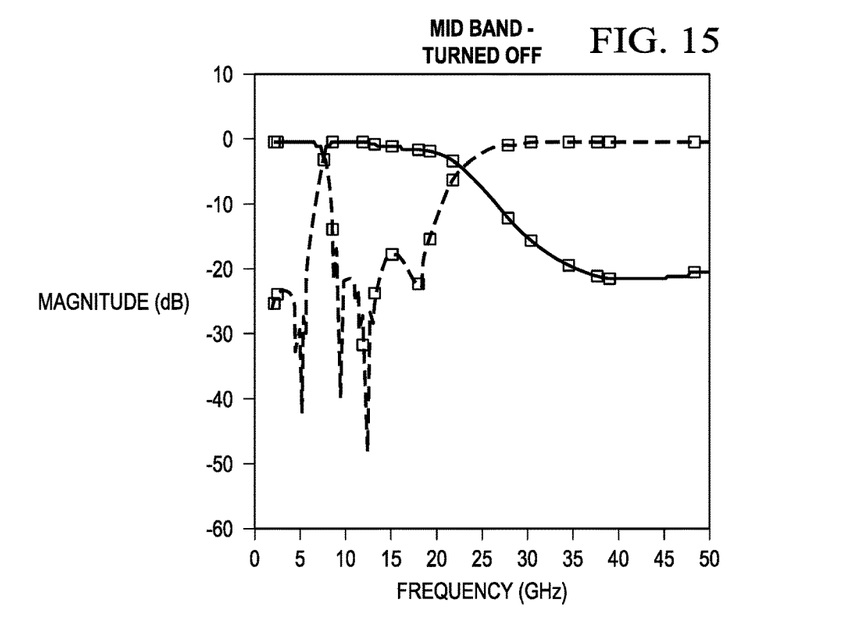
Figure 16:
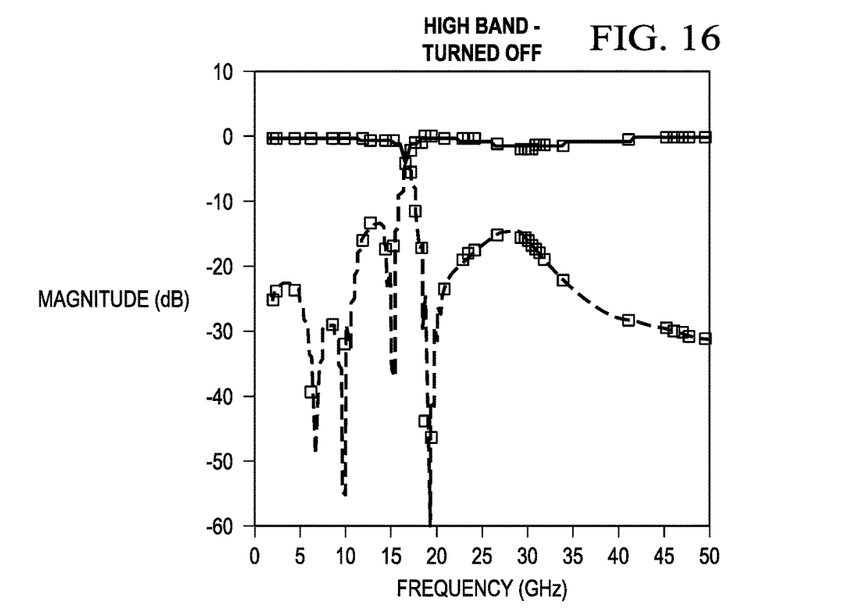

FIG. 6 illustrates an electrical circuit 420 according to another embodiment that includes a plurality of diplexers 422a, 422b, . . . 422n that are provided in a cascaded arrangement. The plurality of diplexers 422a, 422b, . . . 422n can be similar to or the same as the first and second diplexers 22, 24 illustrated in FIG. 1. However, a plurality of matching diplexers 470a, 470b, . . . 470n can be provided that are electrically attached in a cascading arrangement. The plurality of matching diplexers 470a, 470b, . . . 470n can be connected to the plurality of diplexers 422a, 422b, . . . 422n by coupling each high pass filter output of one of the diplexers 422a, 422b, . . . 422n with a corresponding high pass filter output of one of the matching diplexers 470a, 470b, . . . 470n with two port switches (indicated by 'x'). In particular the two port switches from the second port of the high pass filters of the diplexers 422a, 422b, . . . 422n can be coupled with the two port switches from the second port of the high pass filters of the matching diplexers 470a, 470b, . . . 470n. The last low pass filter from the plurality of diplexers 422a, 422b, . . . 422n and the last low pass filter from the plurality of diplexers plurality of matching diplexers 470a, 470b, . . . 470n can also be connected together with two port switches. The two port switches can set such that the network response can be a low pass, high pass, band pass, band reject, or any combination allowed by the number of diplexers in cascade. It is to be appreciated that embedded switching can allow those signals falling at the crossover frequency to be routed entirely to either of the two channels above or below the crossover depending on the switch state. Without switching, signals falling at the crossover frequency are routed equally between the signal paths above and below the crossover.

FIGS. 7-16 illustrate different plots depicting the frequency response of the electrical circuit 420 of FIG. 6 based upon different switching conditions.

It is to be appreciated that the electrical circuits (20, 120, 220, 320, 420) described above can be utilized in a variety of different electrical applications. In accordance with one example, the electrical circuits described above (or a derivation thereof) can be used for high fidelity reception of signals in a densely occupied electromagnetic environment. Practical active radio circuits have a limited dynamic range. This dynamic range is usually sufficient for fiber, coax or twisted pair guided waves absent competing/interfering energy. However that dynamic range is often insufficient for acceptable operation in a densely occupied (multi-user) electromagnetic environment. It is not uncommon to encounter undesired radio energy a billion times (90 dB) stronger than the signal of interest. These active circuits include amplifiers, oscillators, frequency mixers, modulators and demodulators. As analog to digital (A/D) converter and digital to analog converter (D/A) technologies advance they are becoming more integral to radio circuitry. The demand to receive and transmit data at increasingly higher rates requires radios to operate with correspondingly increased instantaneous bandwidth. A/D and D/A converters, along with digital signal processing, are key to enabling operation with increased instantaneous bandwidth. Practical active radio circuits, and in particular A/D and D/A converters require frequency selective filtering to achieve a dynamic range sufficiently for acceptable operation in a densely occupied (multi-user) electromagnetic environment. Filtering is also required for A/D and D/A converters to avoid frequency aliasing resulting from the discrete time sampling.

In accordance with another example, the electrical circuits described above (or a derivation thereof) can be used for coupling radio devices having mismatched frequency coverage such as, for example, in the case of one broadband antenna to multiple bandlimited radios, multiple bandlimited antennas to a single broadband radio, multiple bandlimited antennas to multiple bandlimited radios, and/or harnessing multiple A/D and D/A converters to a common broadband input or output.

In accordance with yet another example, the electrical circuits described above (or a derivation thereof) can be used as an anti-alias and reconstruction filter for converting signals between continuous and discrete time systems.

The foregoing description of embodiments and examples of the disclosure has been presented for purposes of illustration and description. It is not intended to be exhaustive or to limit the disclosure to the forms described. Numerous modifications are possible in light of the above teachings. Some of those modifications have been discussed and others will be understood by those skilled in the art. The embodiments were chosen and described in order to best illustrate the principles of the disclosure and various embodiments as are suited to the particular use contemplated. The scope of the disclosure is, of course, not limited to the examples or embodiments set forth herein, but can be employed in any number of applications and equivalent devices by those of ordinary skill in the art. Rather, it is hereby intended the scope of the invention be defined by the claims appended hereto.

What is claimed is:

1. An electrical circuit comprising:
    a first diplexer comprising:
        a first low pass filter comprising a first input and a first output, wherein the first low pass filter defines a first low pass cutoff frequency; and
        a first high pass filter comprising a second input and a second output, wherein the first high pass filter defines a first high pass cutoff frequency and the first and second inputs are directly electrically coupled together; and
    a second diplexer comprising:
        a second low pass filter comprising a third input and a third output, wherein the second low pass filter defines a second low pass cutoff frequency; and
        a second high pass filter comprising a fourth input and a fourth output, wherein the second high pass filter defines a second high pass cutoff frequency;
        wherein:
            the first output, the third input, and the fourth input are electrically coupled together;
            the second low pass cutoff frequency is less than the first low pass cutoff frequency; and
            the second high pass cutoff frequency is less than the first high pass cutoff frequency.

2. The electrical circuit of claim 1 further comprising a third diplexer comprising:
    a third low pass filter comprising a fifth input and a fifth output, wherein the third low pass filter defines a third low pass cutoff frequency; and
    a third high pass filter comprising a sixth input and a sixth output, wherein the third high pass filter defines a third high pass cutoff frequency; wherein:
        the third output, the fifth input, and the sixth input are electrically coupled together;

the third low pass cutoff frequency is less than the second low pass cutoff frequency; and the third high pass cutoff frequency is less than the second high pass cutoff frequency.

3. The electrical circuit of claim 1 further comprising a first terminated low pass filter comprising a first terminated input that is directly electrically coupled with the second output, the first terminated low pass filter defining a first terminated cutoff frequency that is lower than the first high pass cutoff frequency.

4. The electrical circuit of claim 3 further comprising a first terminated high pass filter comprising a second terminated input that is directly electrically coupled with the first output, the first terminated high pass filter defining a second terminated cutoff frequency that is higher than the first low pass cutoff frequency, wherein the first terminated low pass filter and the first terminated high pass filter each comprise a singly terminated filter.

5. The electrical circuit of claim 3 wherein the first high pass filter and the first terminated low pass filter share an electrical component.

6. The electrical circuit of claim 1 further comprising a first terminated high pass filter comprising a second terminated input that is directly electrically coupled with the first output, the first terminated high pass filter defining a second terminated cutoff frequency that is higher than the first low pass cutoff frequency.

7. The electrical circuit of claim 6 wherein the first low pass filter and the first terminated high pass filter are connected using a shared electrical component.

8. The electrical circuit of claim 1 further comprising a second terminated low pass filter comprising a third terminated input that is directly electrically coupled with the fourth output, the second terminated low pass filter defining a third terminated cutoff frequency that is lower than the second high pass cutoff frequency.

9. The electrical circuit of claim 8 further comprising a second terminated high pass filter comprising a fourth terminated input that is directly electrically coupled with the third output, the second terminated high pass filter defining a fourth terminated cutoff frequency that is higher than the second low pass cutoff frequency, wherein the second terminated low pass filter and the second terminated high pass filter each comprise a singly terminated filter.

10. The electrical circuit of claim 8 wherein the second high pass filter and the second terminated low pass filter are connected using a shared electrical component.

11. The electrical circuit of claim 1 further comprising a second terminated high pass filter comprising a fourth terminated input that is directly electrically coupled with the third output, the second terminated high pass filter defining a fourth terminated cutoff frequency that is higher than the second low pass cutoff frequency.

12. The electrical circuit of claim 11 wherein the second low pass filter and the second terminated high pass filter are connected using a shared electrical component.

13. The electrical circuit of claim 1 further comprising:
a first digital to analog converter coupled with the second output;
a second digital to analog converter coupled with the fourth output; and
a third digital to analog converter coupled with the third output.

14. The electrical circuit of claim 1 further comprising:
a first frequency mixer coupled with the second output;
a second frequency mixer coupled with the fourth output; and
a third frequency mixer coupled with the third output.

15. The electrical circuit of claim 1 wherein the first and second high pass filters and the first and second low pass filters are constructed from ladder networks using series and shunt inductors and capacitors.

16. The electrical circuit of claim 1 wherein the second, third and fourth outputs are used as inputs to produce a combined output at the first and second inputs.

17. The electrical circuit of claim 1 further comprising:
a first duplicate diplexer comprising:
a first duplicate low pass filter comprising a first duplicate input and a first duplicate output, wherein the first duplicate low pass filter defines a first duplicate low pass cutoff frequency; and
a first duplicate high pass filter comprising a second duplicate input and a second duplicate output, wherein the first duplicate high pass filter defines a first duplicate high pass cutoff frequency and the first duplicate and second duplicate inputs are directly electrically coupled together; and
a second duplicate diplexer comprising:
a second duplicate low pass filter comprising a third duplicate input and a third duplicate output, wherein the second duplicate low pass filter defines a second duplicate low pass cutoff frequency; and
a second duplicate high pass filter comprising a fourth duplicate input and a fourth duplicate output, wherein the second duplicate high pass filter defines a second duplicate high pass cutoff frequency;
wherein:
the first duplicate output, the third duplicate input, and the fourth duplicate input are electrically coupled together;
the second duplicate low pass cutoff frequency is less than the first duplicate low pass cutoff frequency;
the second duplicate high pass cutoff frequency is less than the first duplicate high pass cutoff frequency;
the second output is connected to the second duplicate output with a switch;
the fourth output is connected to the fourth duplicate output with a switch; and
the third output is connected to the third duplicate output using a switch.

18. An electrical circuit comprising:
a first diplexer comprising:
a first low pass filter comprising a first input and a first output, wherein the first low pass filter defines a first low pass cutoff frequency; and
a first high pass filter comprising a second input and a second output, wherein the first high pass filter defines a first high pass cutoff frequency and the first and second inputs are directly electrically coupled together; and
a second diplexer comprising:
a second low pass filter comprising a third input and a third output, wherein the second low pass filter defines a second low pass cutoff frequency; and
a second high pass filter comprising a fourth input and a fourth output, wherein the second high pass filter defines a second high pass cutoff frequency; and
a first terminated low pass filter comprising a first terminated input that is directly electrically coupled with the second output, the first terminated low pass filter defining a first terminated cutoff frequency that is lower than the first high pass cutoff frequency; wherein:
the first output, the third input, and the fourth input are electrically coupled together;
the second low pass cutoff frequency is less than the first low pass cutoff frequency; and
the second high pass cutoff frequency is less than the first high pass cutoff frequency.

19. The electrical circuit of claim 18 wherein the first terminated low pass filter comprises a singly terminated filter.

20. An electrical circuit comprising:
a first diplexer comprising:
a first low pass filter comprising a first input and a first output, wherein the first low pass filter defines a first low pass cutoff frequency; and
a first high pass filter comprising a second input and a second output, wherein the first high pass filter defines a first high pass cutoff frequency and the first and second inputs are directly electrically coupled together; and a second diplexer comprising:
a second low pass filter comprising a third input and a third output, wherein the second low pass filter defines a second low pass cutoff frequency; and
a second high pass filter comprising a fourth input and a fourth output, wherein the second high pass filter defines a second high pass cutoff frequency; and a first terminated high pass filter comprising a second terminated input that is directly electrically coupled with the first output, the first terminated high pass filter defining a second terminated cutoff frequency that is higher than the first low pass cutoff frequency; wherein:
the first output, the third input, and the fourth input are electrically coupled together;
the second low pass cutoff frequency is less than the first low pass cutoff frequency; and
the second high pass cutoff frequency is less than the first high pass cutoff frequency.

* * * * *